(12) United States Patent
Lindert et al.

(10) Patent No.: US 7,951,673 B2
(45) Date of Patent: May 31, 2011

(54) FORMING ABRUPT SOURCE DRAIN METAL GATE TRANSISTORS

(75) Inventors: Nick Lindert, Beaverton, OR (US);
Suman Datta, Beaverton, OR (US);
Jack Kavalieros, Portland, OR (US);
Mark L. Doczy, Beaverton, OR (US);
Matthew V. Metz, Hillsboro, OR (US);
Justin K. Brask, Portland, OR (US);
Robert S. Chau, Beaverton, OR (US);
Mark Bohr, Aloha, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/713,432

(22) Filed: Feb. 26, 2010

(65) Prior Publication Data

US 2010/0151669 A1    Jun. 17, 2010

Related U.S. Application Data

(63) Continuation of application No. 10/925,566, filed on Aug. 25, 2004, now Pat. No. 7,704,833.

(51) Int. Cl.
*H01L 29/76* (2006.01)

(52) U.S. Cl. ........ 438/259; 438/270; 438/271; 438/589; 257/E21.444

(58) Field of Classification Search .......... 438/268–271, 438/259, 282, 589, 299–301, 478
See application file for complete search history.

(56) References Cited

U.S. PATENT DOCUMENTS

| | | | | |
|---|---|---|---|---|
| 5,371,024 | A * | 12/1994 | Hieda et al. | 438/291 |
| 5,576,227 | A * | 11/1996 | Hsu | 438/291 |
| 6,218,690 | B1 * | 4/2001 | Kim et al. | 257/288 |
| 6,562,687 | B1 * | 5/2003 | Deleonibus et al. | 438/303 |
| 2002/0001930 | A1 * | 1/2002 | Lee | 438/585 |
| 2002/0037619 | A1 * | 3/2002 | Sugihara et al. | 438/289 |
| 2004/0108558 | A1 * | 6/2004 | Kwak et al. | 257/410 |
| 2004/0121546 | A1 * | 6/2004 | Yoo | 438/268 |

* cited by examiner

*Primary Examiner* — Thanh Nguyen
(74) *Attorney, Agent, or Firm* — Trop, Pruner & Hu, P.C.

(57) ABSTRACT

A gate structure may be utilized as a mask to form source and drain regions. Then the gate structure may be removed to form a gap and spacers may be formed in the gap to define a trench. In the process of forming a trench into the substrate, a portion of the source drain region is removed. Then the substrate is filled back up with an epitaxial material and a new gate structure is formed thereover. As a result, more abrupt source drain junctions may be achieved.

6 Claims, 5 Drawing Sheets

FORMING ABRUPT SOURCE DRAIN METAL GATE TRANSISTORS

CROSS-REFERENCE TO RELATED APPLICATIONS

This application is a continuation of U.S. patent application Ser. No. 10/925,566, filed on Aug. 25, 2004 now U.S. Pat. No. 7,704,833.

BACKGROUND

The present invention relates to methods for making semiconductor devices, in particular, semiconductor devices with metal gate electrodes.

MOS field-effect transistors with very thin gate dielectrics made from silicon dioxide may experience unacceptable gate leakage currents. Forming the gate dielectric from certain high dielectric constant (K) dielectric materials, instead of silicon dioxide, can reduce gate leakage. As used herein, high-k dielectric means having a dielectric constant higher than 10.

Because such a high-k dielectric layer may not be compatible with polysilicon, it may be desirable to use metal gate electrodes in devices that include high-k gate dielectrics. When making a CMOS device that includes metal gate electrodes, it may be necessary to make the NMOS and PMOS gate electrodes from different materials. A replacement gate process may be used to form gate electrodes from different metals. In that process, a first polysilicon layer, bracketed by a pair of spacers, is removed selectively to a second polysilicon layer to create a trench between the spacers. The trench is filled with a first metal. The second polysilicon layer is then removed, and replaced with a second metal that differs from the first metal.

Thus, there is a need for alternate ways to form replacement metal gate electrodes.

Features shown in these figures are not intended to be drawn to scale.

DETAILED DESCRIPTION

Figure 1:
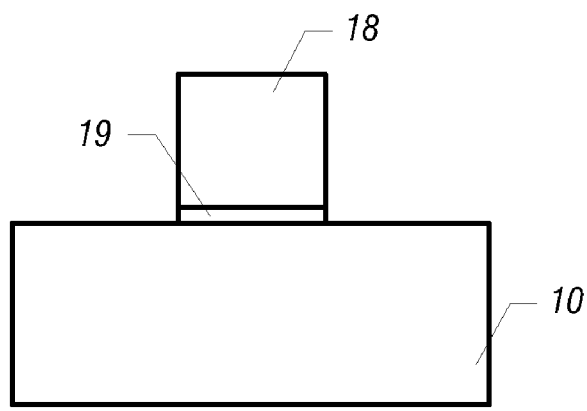
FIGS. 1-9 represent cross-sections of structures that may be formed when carrying out an embodiment of the present invention.

Initially, a dummy dielectric layer 19 is formed on substrate 10, shown in FIG. 1. The layer 19 may be 20-30 Angstroms of silicon dioxide in one embodiment. Substrate 10 may comprise a bulk silicon or silicon-on-insulator substructure. Alternatively, substrate 10 may comprise other materials—which may or may not be combined with silicon—such as: germanium, indium antimonide, lead telluride, indium arsenide, indium phosphide, gallium arsenide, or gallium antimonide. Although a few examples of materials from which substrate 10 may be formed are described here, any material that may serve as a foundation upon which a semiconductor device may be built falls within the spirit and scope of the present invention.

A sacrificial layer 18 is formed on the dummy dielectric layer 19. Sacrificial layer 18 may comprise polysilicon in one embodiment. Sacrificial layer 18 may be, for example, between about 100 and about 2,000 Angstroms thick, and, in one embodiment, between about 500 and about 1,600 Angstroms thick.

Conventional wet or dry etch processes may be used to remove unprotected parts of the sacrificial layer 18 and dummy oxide layer 19.

Figure 2:
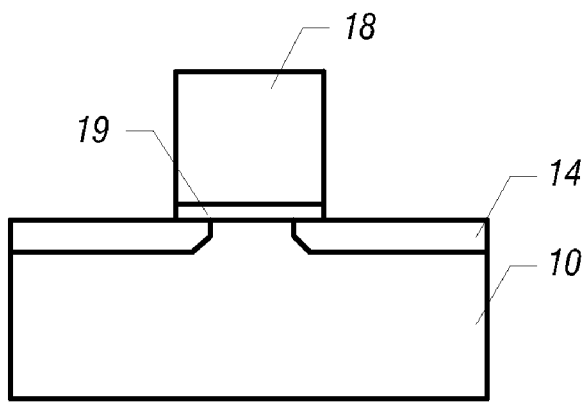

The patterned sacrificial layer 18 may be used as a mask for ion implanting the shallow source drain regions 14, as shown in FIG. 2. The depicted structure may be applicable to the formation of either NMOS or PMOS transistors of a complementary metal oxide semiconductor integrated circuit.

Figure 3:
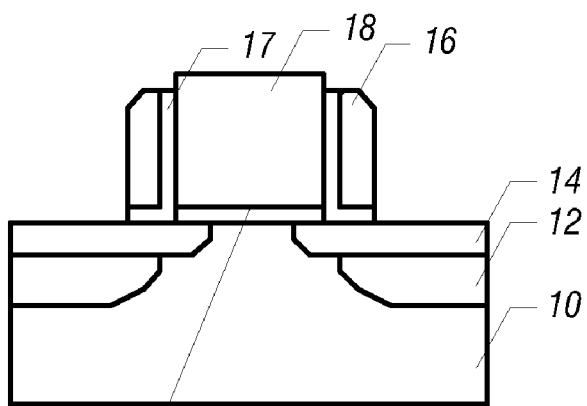

After forming the FIG. 2 structure, sidewall spacers 17 and 16 may be formed on opposite sides of sacrificial layer 18 as shown in FIG. 3. When the spacer 16 comprises silicon nitride, it may be formed in the following way. First, a silicon nitride layer of substantially uniform thickness, for example, less than about 1000 Angstroms thick—is deposited over the entire structure. Conventional deposition processes may be used to generate that structure.

In one embodiment, the silicon nitride layer is deposited directly on substrate 10 and opposite sides of sacrificial layer 18 after first forming a buffer oxide layer 17 on substrate 10 and layer 18.

The silicon nitride layer may be etched using a conventional process for anisotropically etching silicon nitride. As a result of that etch step, sacrificial layer 18 is bracketed by a pair of sidewall spacers 16, 17.

As is typically done, it may be desirable to perform masking and ion implantation steps to create the deep source and drain regions 12, after forming spacers 16, 17, by implanting ions into the substrate 10, followed by applying an appropriate anneal step, as shown in FIG. 3.

The anneal will activate the dopants that were previously introduced into the deep source and drain regions 12 and shallow regions 14 and into sacrificial layer 18. In a preferred embodiment, a rapid thermal anneal is applied that takes place at a temperature that exceeds about 1,000° C.—and, optimally, that takes place at 1,080° C.

Figure 4:
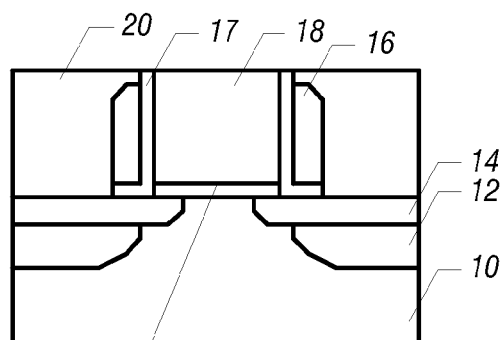

After forming spacers 16, 17, dielectric layer 20 may be deposited over the device, generating the FIG. 4 structure. Dielectric layer 20 may, for example, comprise silicon dioxide, or a low-k material. Dielectric layer 20 may be doped with phosphorus, boron, or other elements, and may be formed using a high density plasma deposition process.

Dielectric layer 20 is removed from patterned sacrificial layer 18 as shown in FIG. 4. A conventional chemical mechanical polishing ("CMP") operation may be applied to remove that part of dielectric layer 20.

Figure 5:
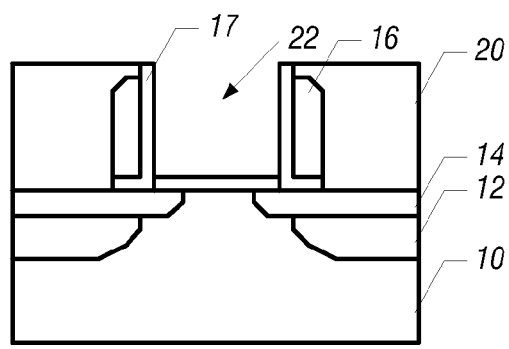

After forming the FIG. 4 structure, sacrificial layer 18 is removed to generate trench 22 that is positioned between sidewall spacers 16, 17, producing the structure shown in FIG. 5.

In one embodiment, a wet etch process that is selective for one conductivity layer 18 over sacrificial layers of a different conductivity is applied without removing significant portions of opposite conductivity type sacrificial layers.

When sacrificial layer 18 is doped n-type, such a wet etch process may comprise exposing sacrificial layer 18 to an aqueous solution that comprises a source of hydroxide for a sufficient time at a sufficient temperature to remove substantially all of layer 18. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

Any remaining sacrificial layer 18 may be selectively removed by exposing it to a solution, which is maintained at a temperature between about 15° C. and about 90° C. (for example, below about 40° C.), that comprises between about 2 and about 30 percent ammonium hydroxide by volume in deionized water. During that exposure step, which preferably lasts at least one minute, it may be desirable to apply sonic energy at a frequency of between about 10 kHz and about 2,000 kHz, while dissipating at between about 1 and about 10 Watts/cm$^2$.

In one embodiment, sacrificial layer 18, with a thickness of about 1,350 Angstroms, may be selectively removed by exposing it at about 25° C. for about 30 minutes to a solution that comprises about 15 percent ammonium hydroxide by volume in deionized water, while applying sonic energy at about 1,000 kHz—dissipating at about 5 Watts/cm$^2$.

As an alternative, sacrificial layer 18 may be selectively removed by exposing it for at least one minute to a solution, which is maintained at a temperature between about 60° C. and about 90° C., that comprises between about 20 and about 30 percent TMAH by volume in deionized water, while applying sonic energy. Removing sacrificial layer 104, with a thickness of about 1,350 Angstroms, by exposing it at about 80° C. for about 2 minutes to a solution that comprises about 25 percent TMAH by volume in deionized water, while applying sonic energy at about 1,000 kHz—dissipating at about 5 Watts/cm$^2$—may remove substantially all of layer 18 without removing a significant amount of the sacrificial layer for the opposite conductivity type transistor. The dummy gate dielectric layer 19 may be sufficiently thick to prevent the etchant that is applied to remove sacrificial layer 18 from reaching the channel region that is located beneath dummy dielectric layer 19.

Figure 6:
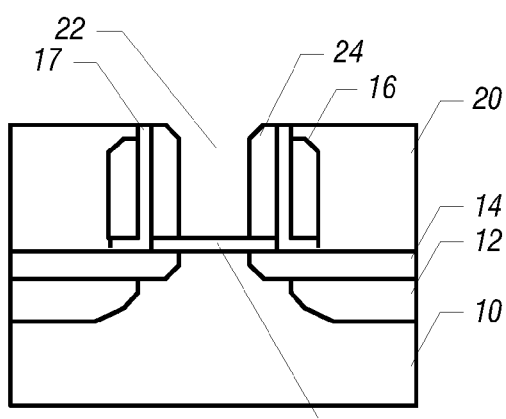
Figure 7:
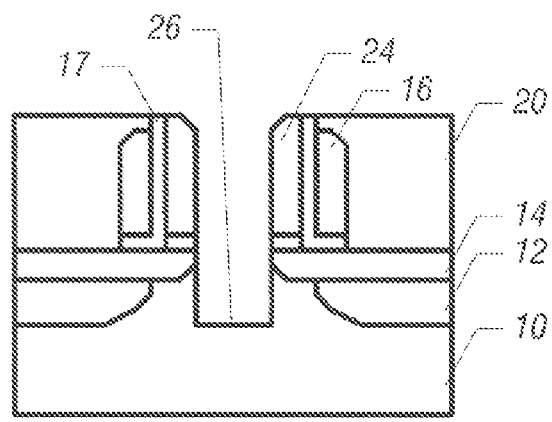

Referring to FIG. 6, sidewall spacers 24 may be formed within the trench 22. The spacers 24, which may be formed of nitride, form an offset from the final gate edge to allow overlap over the source drain regions. In one embodiment, the spacers 24 may be less than 10 nanometers wide. Next, a wet etch may be utilized to remove the thin dielectric layer 19. For example, hydrofluoric acid may be utilized. Then a dry etch may be used to etch the silicon in the channel region that is exposed by the opening between the spacers 24. In one embodiment, the dry etch may use sulfur hexafluoride (SF6), chlorine, or NF3. The result is a trench 26, which extends down to a depth approximately equal to the depth of a deep source drain region 12, in one embodiment of the present invention, as shown in FIG. 7.

Figure 8:
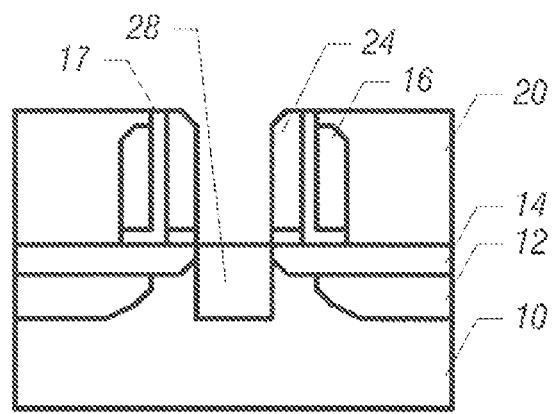

Then, as shown in FIG. 8, a portion of the trench 26 may be filled up to the level of the upper surface of the shallow source drain 14 with epitaxial material 28. The material 28 may, for example, be germanium, silicon germanium, InSb, or carbon-doped silicon, to mention a few examples. For example, an n-type epitaxial layer of $Si_{1-x}Ge_x$, with 1E19 cm$^{-3}$ doping levels may develop compressive stress in the direction of current flow.

The material 28 may be heavily doped at the base and lightly doped at the surface in one embodiment. In other embodiments, the material 28 may be uniformly undoped, lightly doped, or heavily doped. A p-type selective epitaxial region may be utilized in PMOS structures.

Then the spacers 24 may be removed, for example, using phosphoric acid, and the underlying, remaining portions of the gate dielectric 19 may also be removed. In one embodiment, a thin oxide (not shown), less than 30 nanometers, may be grown at low temperature or may be chemically grown to protect the epitaxially grown material 28. Phosphoric acid is selective of such an oxide.

Figure 9:
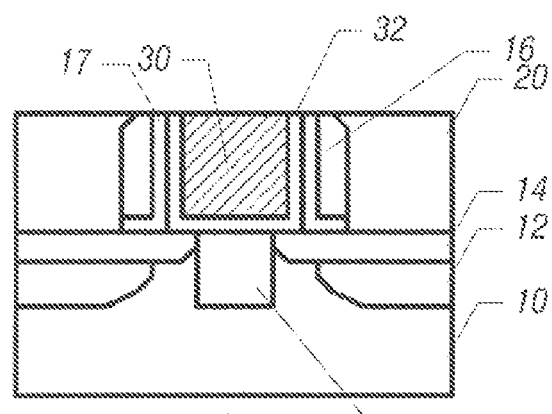

As shown in FIG. 9, a U-shaped high-k dielectric layer 32 may be formed. Some of the materials that may be used to make high-k gate dielectric layer 32 include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide and aluminum oxide. Although a few examples of materials that may be used to form high-k gate dielectric layer 32 are described here, that layer may be made from other materials that serve to reduce gate leakage. The layer 32 has a dielectric constant higher than 10 and from 15 to 25 in one embodiment of the present invention.

High-k gate dielectric layer 32 may be formed on the material 28 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between material 28 and high-k gate dielectric layer 32. The CVD reactor should be operated long enough to form a layer with the desired thickness. In most applications, high-k gate dielectric layer 32 may be less than about 60 Angstroms thick, for example, and, in one embodiment, between about 5 Angstroms and about 40 Angstroms thick.

N-type metal layer 30 may be formed on the layer 32 in an NMOS example. The layer 30 may comprise any n-type conductive material from which a metal NMOS gate electrode may be derived. N-type metal layer 30 preferably has thermal stability characteristics that render it suitable for making a metal NMOS gate electrode for a semiconductor device.

Materials that may be used to form n-type metal layer 30 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide. N-type metal layer 30 may be formed on first high-k gate dielectric layer 32 using well known PVD or CVD processes, e.g., conventional sputter or atomic layer CVD processes. As shown in FIG. 9, n-type metal layer 30 is removed except where it fills trench 26. Layer 30 may be removed from other portions of the device via a wet or dry etch process, or an appropriate CMP operation. Dielectric layer 32 may serve as an etch or polish stop.

N-type metal layer 30 may serve as a metal NMOS gate electrode that has a workfunction that is between about 3.9 eV and about 4.2 eV, and that is between about 25 Angstroms and about 2,000 Angstroms thick and, in one embodiment, may particularly be between about 500 Angstroms and about 1,600 Angstroms thick.

The resulting structure has channel stress extending outwardly in the direction of current flow towards the source and drain. The stress occurs because the silicon germanium lattice is bigger than the silicon lattice. The germanium concentration may be tailored to achieve the maximum amount of stress.

After forming n-type metal layer 30, the sacrificial layer 18 for the PMOS device is removed to generate the trench that is positioned between sidewall spacers for the PMOS devices. In a preferred embodiment, the PMOS sacrificial layer 18 is exposed to a solution that comprises between about 20 and about 30 percent TMAH by volume in deionized water for a sufficient time at a sufficient temperature (e.g., between about 60° C. and about 90° C.), while applying sonic energy, to remove all of the PMOS sacrificial layer without removing significant portions of n-type metal layer.

Alternatively, a dry etch process may be applied to selectively remove the PMOS sacrificial layer 18. When the sacrificial layer 18 is doped p-type (e.g., with boron), such a dry etch process may comprise exposing sacrificial layer 106 to a plasma derived from sulfur hexafluoride ("$SF_6$"), hydrogen bromide ("HBr"), hydrogen iodide ("HI"), chlorine, argon, and/or helium. Such a selective dry etch process may take place in a parallel plate reactor or in an electron cyclotron resonance etcher.

The PMOS sacrificial layer 18 may be replaced by the PMOS layer 30 as described in connection with the n-type layer. The p-type metal layer 30 may comprise any p-type conductive material from which a metal PMOS gate electrode may be derived. The p-type metal layer preferably has thermal stability characteristics that render it suitable for making a metal PMOS gate electrode for a semiconductor device.

Materials that may be used to form p-type metal layer 30 include: ruthenium, palladium, platinum, cobalt, nickel, and conductive metal oxides, e.g., ruthenium oxide. P-type metal layer 30 may be formed on the second high-k gate dielectric layer using well known PVD or CVD processes, e.g., conventional sputter or atomic layer CVD processes. The p-type metal layer is removed except where it fills the trench. Layer 30 may be removed from other portions of the device via a wet or dry etch process, or an appropriate CMP operation, with dielectric layer 32 serving as an etch or polish stop.

P-type metal layer 30 may serve as a metal PMOS gate electrode with a workfunction that is between about 4.9 eV and about 5.2 eV, and that is between about 100 Angstroms and about 2,000 Angstroms thick, and more preferably is between about 500 Angstroms and about 1,600 Angstroms thick.

Figure 10:
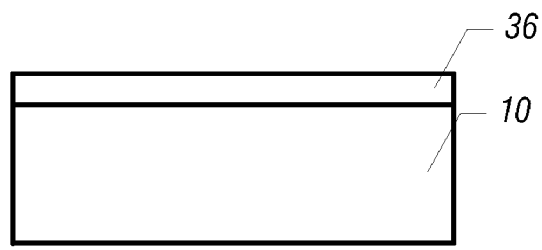
FIGS. 10-12 represent cross-sections of structures that may be formed when carrying out an embodiment of the present invention.
Figure 11:
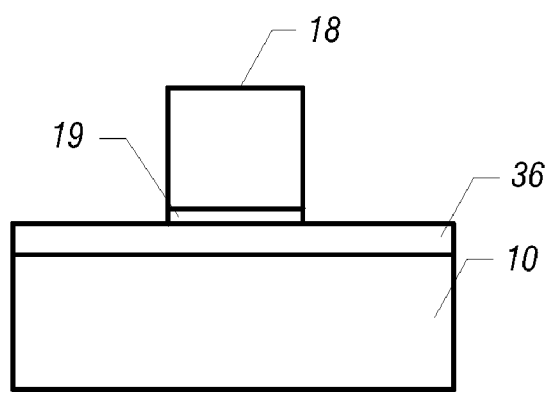
Figure 12:
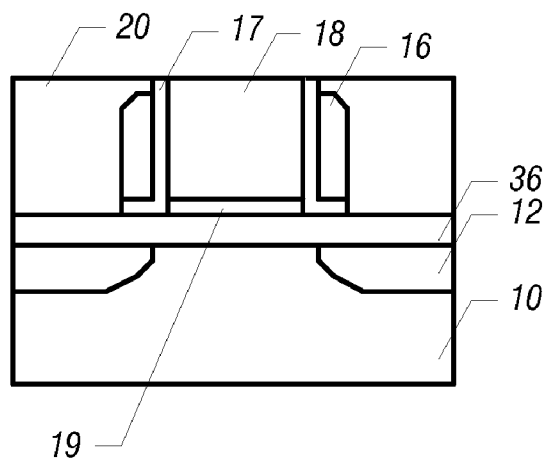
Figure 13:
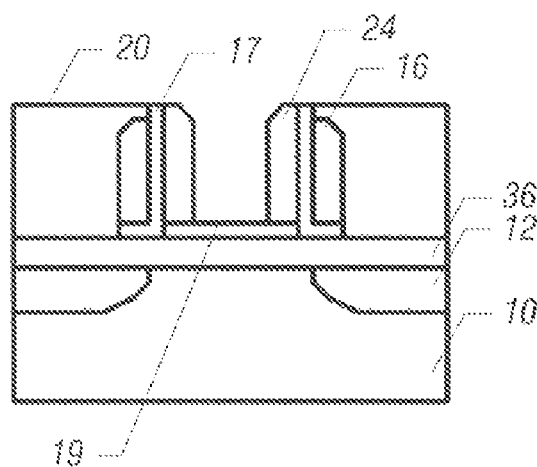
FIGS. 13-14 represent cross-sections of structures that may be formed when carrying out an embodiment of the present invention.
Figure 14:
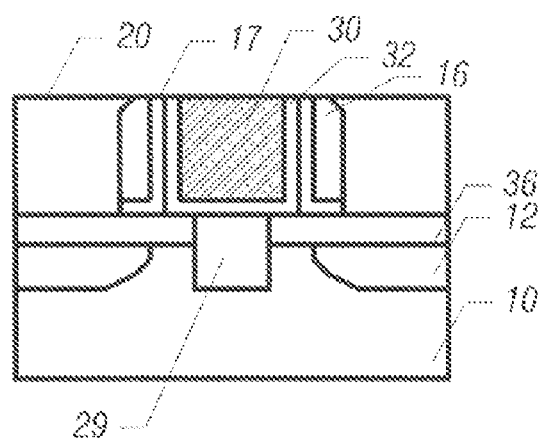

Referring to FIG. 10, in accordance with another embodiment of the present invention, source drain extension doping 36 is applied initially by ion implanting arsenic to form a source drain extension in the substrate 10. Thereafter, the sacrificial layer 18 and a gate dielectric 19 may be deposited and patterned as shown in FIG. 11. Then the structure shown in FIG. 12 may be produced (corresponding to the structure of FIG. 4 and using the same techniques). The rest of the process may proceed as explained previously. Namely, the layer 18 may be removed, as indicated in FIG. 13, and a trench formed using the spacers 24 as a mask. The epitaxial material 28 fills the lower portion of the trench 26. A gate dielectric 32 is applied and the trench is filled with the gate electrode 30 as shown in FIG. 14.

The approach shown in FIGS. 10-14 may produce even more abrupt source drain extensions. In this embodiment, extremely shallow extensions may be achieved without concern about providing the necessary gate underlap, thereby providing improved short channel control without increasing external resistance. The portion of the extension 36 under the channel is removed in the ensuing etch to form the trench 26.

Figure 15:
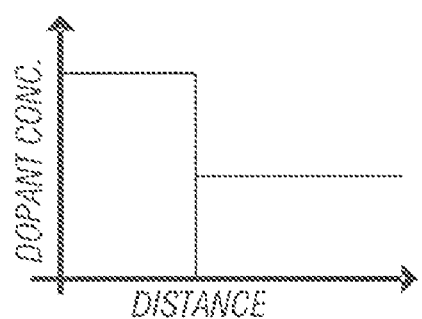
FIG. 15 is a plot of dopant concentration versus distance for one embodiment of the present invention.

Referring to FIG. 15, the region to the left of the epitaxial material 28, the source drain extension 36 doping is relatively high. The concentration abruptly changes, moving to the right at the inserted material 28, to a much lower dopant concentration corresponding to the amount of doping provided in the epitaxial material 28.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   etching a substrate through a gap in a dielectric layer lined by sidewall spacers;
   filling the etched substrate with a semiconductor material;
   removing said sidewall spacers; and
   forming a gate electrode in said gap.

2. The method of claim 1 including using said spacers to etch a trench into said substrate through said gap.

3. The method of claim 2 including depositing a semiconductor material into said trench to partially fill said trench.

4. The method of claim 3 including filling said trench to a level substantially equal to the level of said substrate.

5. The method of claim 4 including forming a gate dielectric and a gate electrode over said semiconductor material.

6. The method of claim 5 including filling said trench with an epitaxial material.

* * * * *